United States Patent
Lerner et al.

(10) Patent No.: US 6,412,503 B1
(45) Date of Patent: Jul. 2, 2002

(54) MAGNETICALLY COUPLED SUBSTRATE ROLLER

(75) Inventors: Alexander Lerner, San Jose; Manoocher Birang, Los Gatos, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 72 days.

(21) Appl. No.: 09/583,145

(22) Filed: May 30, 2000

Related U.S. Application Data
(60) Provisional application No. 60/136,909, filed on Jun. 1, 1999.

(51) Int. Cl.[7] .................................................. B08B 3/00
(52) U.S. Cl. ........................ 134/157; 134/184; 134/902; 211/41.18
(58) Field of Search ........................ 134/33, 157, 902, 134/137, 140, 147, 184; 211/41.17, 41.18

(56) References Cited

U.S. PATENT DOCUMENTS

| | | | | |
|---|---|---|---|---|
| 3,964,957 A | * | 6/1976 | Walsh | 156/345 |
| 4,052,577 A | * | 10/1977 | Votta | 200/147 R |
| 5,058,611 A | * | 10/1991 | Liers et al. | 134/105 |
| 5,090,432 A | * | 2/1992 | Bran | 134/139 |
| 5,672,212 A | * | 9/1997 | Manos | 134/1.3 |
| 6,119,708 A | * | 9/2000 | Fishkin et al. | 134/140 |
| 6,181,040 B1 | * | 1/2001 | Schob | 310/90.5 |
| 6,247,889 B1 | * | 6/2001 | Kono et al. | 414/744.5 |
| 6,269,548 B1 | * | 8/2001 | Shinozaki et al. | 34/58 |
| 6,337,030 B1 | * | 1/2002 | Sakaguchi | 156/345 |

* cited by examiner

Primary Examiner—Randy Gulakowski
Assistant Examiner—Joseph Perrin
(74) Attorney, Agent, or Firm—Dugan & Dugan

(57) ABSTRACT

A magnetically coupled roller assembly is provided. A magnet is positioned on the roller and couples to a roller positioned on a drive assembly. The roller and driver are separated by a chamber wall and magnetically coupled therethrough. A shaft coupled to the roller may be positioned in a pocket formed in the chamber wall, and the roller and driver magnets may be axially offset so as to "pull" the roller toward the interior of the pocket.

11 Claims, 2 Drawing Sheets

MAGNETICALLY COUPLED SUBSTRATE ROLLER

This application claims priority from U.S. provisional application Serial No. 60/136,909, filed Jun. 1, 1999.

FIELD OF THE INVENTION

The present invention relates to the rotation of thin disks. More specifically, the present invention relates to an improved roller for rotating semiconductor substrates within a tank of fluid.

BACKGROUND OF THE INVENTION

A conventional method for cleaning particles from semiconductor wafers submerged within a tank of fluid is known as megasonic cleaning. During megasonic cleaning, a transducer oscillates between compressed and strained states at a rate near 1 MHz. The megasonic oscillation output by the transducer is coupled to the fluid contained within the tank, causing pressure oscillation therein. As the pressure in the fluid oscillates between positive and negative, cavitations or bubbles form in the liquid during negative pressure and collapse or shrink during positive pressure. This bubble oscillation gently cleans the surface of the wafer.

In practice, megasonic cleaners experience a number of limitations. For instance, the intensity of the cleaning energy experienced across the wafer's surface often decreases with increased distance from the transducer. This energy gradient necessitates wafer rotation in order to achieve uniform cleaning across the entire wafer surface.

Conventionally, to achieve rotation, a wafer is positioned on a pair of rollers each of which are mounted to a shaft that extends through the wall of the megasonic tank. Outside the megasonic tank each shaft is coupled to a motor that when energized causes the shaft, and the roller attached thereto, to rotate. As the rollers rotate, so does the wafer positioned thereon.

Although such roller assemblies facilitate uniform wafer cleaning across the entire surface of the wafer, they also experience several drawbacks, such as causing cleaning fluid leakage. In an effort to prevent cleaning fluid leakage, rubber seals are used to seal between the roller shaft and the wall of the tank. In practice, however, the heat and chemistry of the tank fluid degrade the seals and leaking inevitably occurs. Fluid leaking undesirably increases the systems operating costs. To reduce this cost, the leaking fluid is sometimes collected, filtered and recirculated to the tank. The degrading seals and leaking chemistry present a potential particle source, and, because leaking rates are random, introduce variables to the cleaning process. Eventually the seals have to be replaced causing downtime costs, as well as labor and replacement parts costs.

Accordingly, a need exists for an improved method and apparatus for rotating a substrate as it is processed within a fluid tank.

SUMMARY OF THE INVENTION

The present invention overcomes the problems described above, by providing a roller which magnetically couples a driver for rotating the roller (i.e., an inventive roller/driver assembly). Because the roller and driver are magnetically coupled, no openings are required in the walls of the fluid filled processing tank, and no leakage occurs. In one aspect, an outwardly extending pocket is formed in or sealed to a wall of the processing tank, and a shaft of the inventive roller/driver assembly is supported by the pocket. This configuration has been found to provide excellent positional accuracy.

Because of the magnetic coupling between the driver and the roller, the roller may be easily installed and removed, often requiring no tools whatsoever. Further, in the pocket embodiment a magnet positioned on the roller is axially offset from a magnet positioned on the driver, the driver magnet being positioned outside (i.e., in a direction away from the tank) relative to the roller magnet. The axial offset causes the roller magnet to be attracted outwardly, away from the tank, and thus continuously pulls the roller shaft into the pocket. Accordingly, in certain embodiments, no rings or locking devices are required to lock either the roller assembly or the driver assembly in place, and no metal parts are exposed to the cleaning fluid chemistry, therefore corrosion may be avoided. Moreover, cleaning fluid leakage may be completely eliminated resulting in less wafer to wafer processing variations and less particle generation. Fluid filled processing tanks which employ the inventive roller/driver system may be able to provide higher throughput with lower consumable costs and higher, more consistent quality yields.

Other features and advantages of the present invention will become more fully apparent from the following detailed description of the preferred embodiments, the appended claims and the accompanying drawings.

DETAILED DESCRIPTION OF THE PREFERRED EMBODIMENTS

Figure 1:
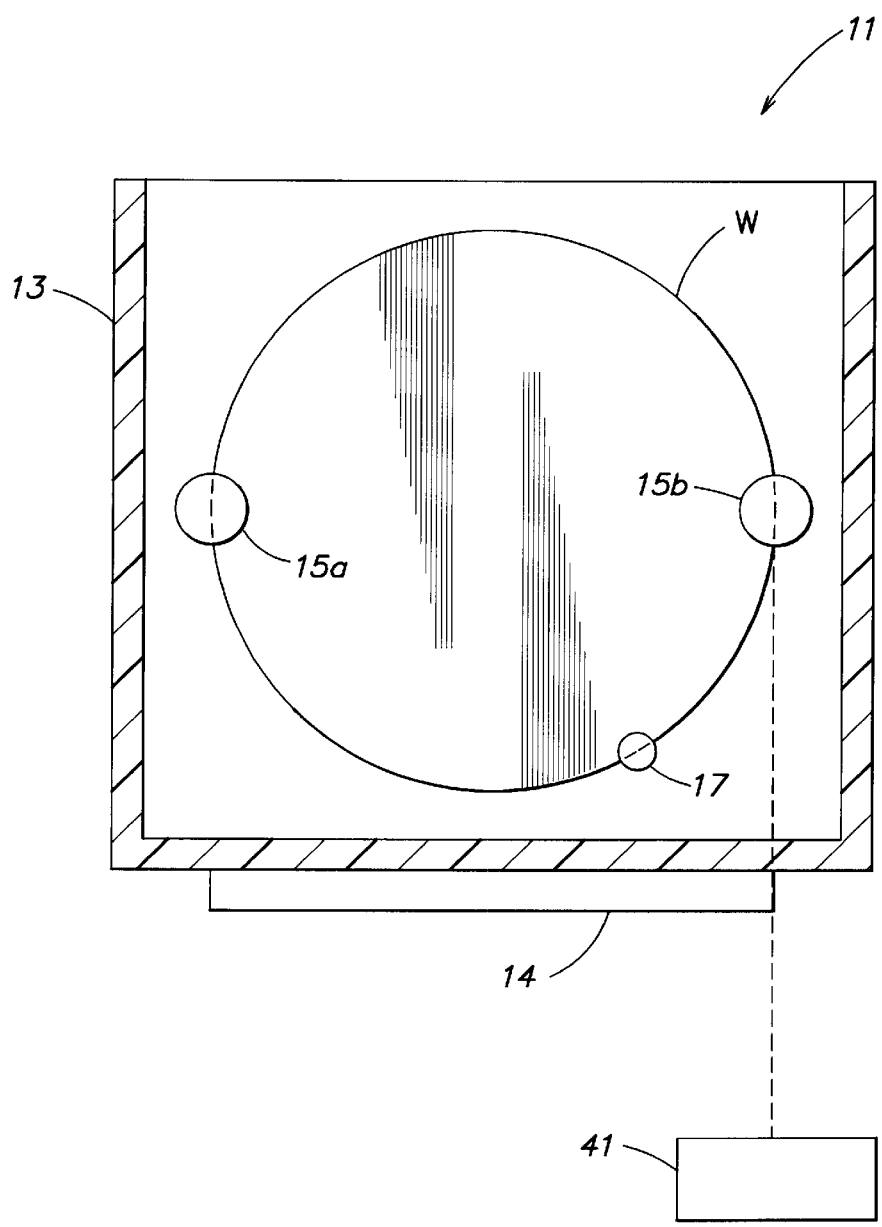
FIG. 1 is a front elevational view of a megasonic tank that employs the inventive roller assembly.

FIG. 1 is a front elevational view of a megasonic tank system 11. The megasonic tank system 11 comprises a tank 13 (e.g., a plastic tank), having a transducer 14 positioned along the bottom thereof (either inside or outside the tank 13). The transducer 14 may be equal in length to the diameter of a wafer W to be cleaned thereby. Above the transducer 14 a first inventive roller assembly 15a and a second inventive roller assembly 15b are positioned to vertically support a wafer W in line with the transducer 14. A stabilizing mechanism 17 is positioned outside of the point along the wafer W's edge which is closest to the transducer 14, and is therefore outside of the transducer 14's highest energy field. The stabilizing mechanism 17 may be positioned so as to contact the wafer W at any point that will sufficiently reduce or prevent the wafer W from wobbling. Typically the inventive roller assemblies 15a[<m]ed, 15b and the stabilizing mechanism 17 each comprise a groove for supporting a wafer W with minimal contact. The inventive roller assemblies 15a, 15b which support the wafer W are described in detail with reference to FIG. 2.

Figure 2:
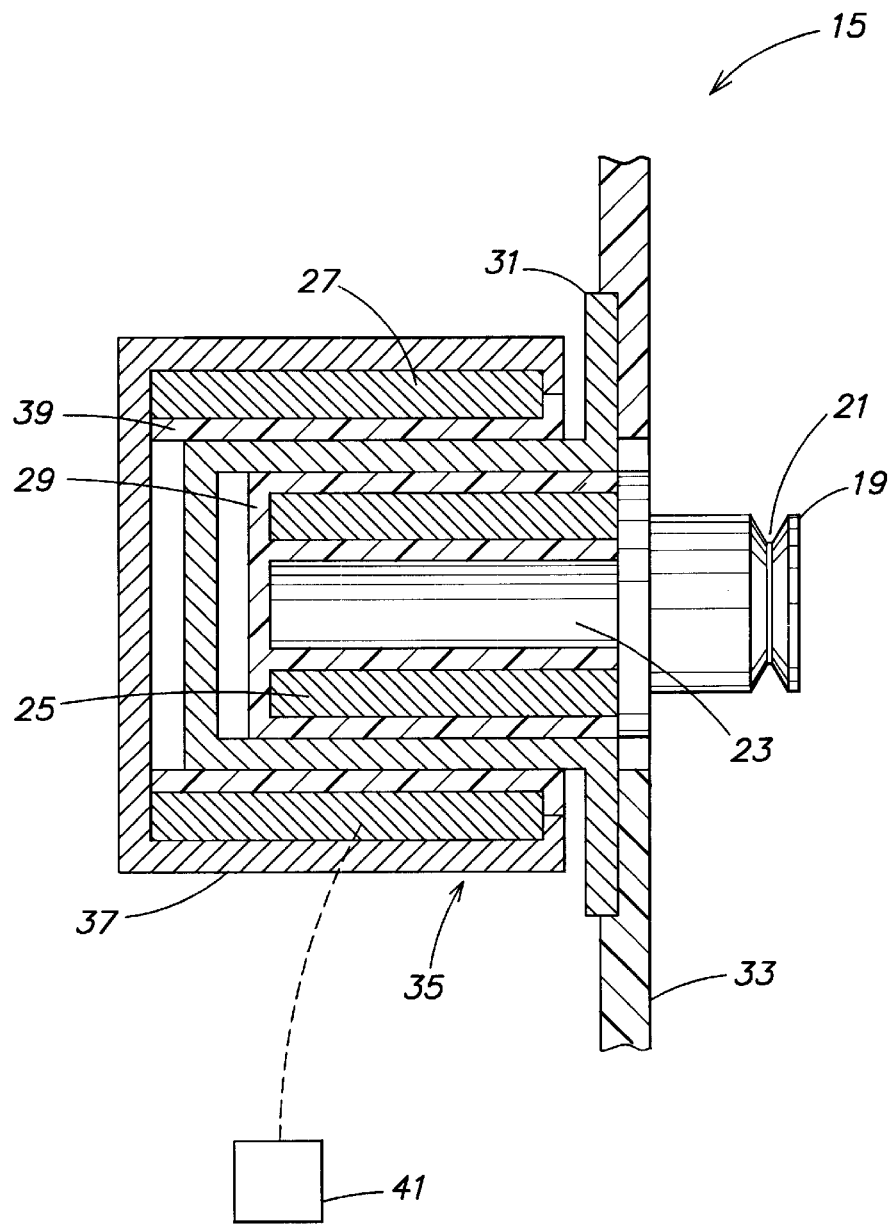
FIG. 2 is a side elevational view of one aspect of the inventive roller assembly which eliminates fluid leakage.

FIG. 2 is a side elevational view of an embodiment of the inventive roller assembly 15 which may eliminate fluid leakage. The inventive roller assembly 15 comprises a wafer support 19 having a groove 21 in which the wafer W (FIG. 1) is positioned. To enhance friction between the wafer support 19 and the wafer W, the groove 21 may be bead blasted, knurled or may have a plurality of small holes drilled therein, along the portion of the wafer support 19 which contacts the wafer W. The inventive roller assembly 15 further comprises a shaft 23 having a magnet 25 coupled thereto. The shaft magnet 25 may be shaped like a sleeve which extends around the entire circumference of the shaft 23, although the shaft magnet 25 may be any size or shape as long as sufficient coupling exists between the shaft magnet(s) 25 and an external drive magnet 27, to achieve rotation of the shaft 23. In one aspect, the shaft magnet 25 is enclosed in a plastic enclosure 29 which is sealed to the shaft 23.

The shaft 23 of the inventive roller assembly 15 is mounted in an outwardly extending housing or pocket 31. The pocket 31 may be integral with a wall 33 of the megasonic tank 13, or may be a separate housing, preferably plastic, which seals around an opening in the wall 33 of the megasonic tank 13, as shown in FIG. 2. The pocket 31 and the inventive roller assembly 15 are sized so that the inventive roller assembly 15 is firmly supported by the pocket 31, but is able to rotate therein.

The pocket 31 also supports a driver assembly 35 which is external to the pocket 31. The driver assembly 35 comprises the drive magnet 27 which may comprise a sleeve which extends around the entire circumference of the pocket 31, although the drive magnet(s) 27 may be any size or shape as long as sufficient coupling exists between the drive magnet 27 and the shaft magnet 25. The shaft magnet 25 and the drive magnet 27 are of opposite polarity so that an attractive force exists therebetween. The attractive force is strong enough to rotate the roller assembly 15 when the driver assembly 35 rotates. The drive magnet 27 may be mounted between an outer metal housing 37 and an inner plastic housing 39, which encircles the pocket 31, and the inner plastic housing 39 may be sized so as to be firmly supported by the pocket 31 but able to rotate therearound. The driver assembly 35 is further coupled to a driving mechanism such as a motor 41.

In operation, the motor 41 is energized and begins rotating the driver assembly 35. The magnetic coupling between the drive magnet 27 and the shaft magnet 25 causes the inventive roller assembly 15 to rotate as the driver assembly 35 rotates. Friction between the groove 21 and the wafer W positioned therein causes the wafer W to rotate. The transducer 14 is energized and begins oscillating at a megasonic rate. Megasonic energy is therefore coupled to the fluid and travels upward therethrough to contact the surface of the wafer W. As the wafer W rotates, the stabilizing mechanism 17 passively rotates therewith, while reducing and preferably preventing wafer wobble. Energy from the transducer 14 cleans the rotating wafer W as is known in the art. The level of cleaning fluid contained within the megasonic tank 13 varies less than that experienced by megasonic tanks which employ conventional rollers. Accordingly, the inventive roller assembly 15 may add significant value to the megasonic tank 13, and to any automated cleaning/processing system in which the megasonic tank 13 is employed.

The foregoing description discloses only the preferred embodiments of the invention, modifications of the above disclosed apparatus and method which fall within the scope of the invention will be readily apparent to those of ordinary skill in the art. The configuration and operation of the megasonic tank 13 and the location of the inventive roller assemblies are merely exemplary, as are the specific shapes, sizes and materials of the roller assembly components pictured herein. The roller assembly groove may or may not have a roughened surface.

Accordingly, while the present invention has been disclosed in connection with the preferred embodiments thereof, it should be understood that other embodiments may fall within the spirit and scope of the invention, as defined by the following claims.

The invention claimed is:

1. A fluid containing processing tank, comprising:

a tank for containing a fluid;

a roller adapted to support a substrate, the roller being positioned within the tank so as to be at least partially submerged in the tank fluid;

a first magnet coupled to the roller; and a second magnet positioned outside the tank and coupled to the first magnet through a wall of the tank.

2. The apparatus of claim 1 wherein the roller comprises a shaft, having the first magnet coupled thereto, the tank comprises an outwardly extending pocket and the shaft is supported by the outwardly extending pocket.

3. The apparatus of claim 2 wherein the first and second magnets are axially offset so as to pull the roller shaft into the pocket.

4. The apparatus of claim 1 further comprising a driver assembly, having a drive magnet coupled to the pocket, and magnetically coupled through the pocket to the shaft magnet.

5. The apparatus of claim 4 wherein the drive magnet comprises a sleeve which extends around an exterior diameter of the pocket.

6. The apparatus of claim 5 wherein the drive magnet and the shaft magnet are positioned such that when the shaft is inserted as far as possible into the pocket, the drive magnet is offset from the shaft magnet such that attraction between the drive magnet and the shaft magnet pulls outwardly on the shaft magnet.

7. The apparatus of claim 1 further comprising a transducer coupled to the tank and a power source coupled to the transducer so that the transducer may impart sonic energy to the fluid contained in the tank.

8. A method of rotating an object contained in the fluid bath, comprising:

placing a roller assembly having a first magnet inside a tank containing a fluid bath;

magnetically coupling the first magnet through a wall of the tank, to a second magnet; and rotating the second magnet to thereby cause rotation of the roller assembly.

9. The method of claim 8 wherein placing a roller assembly having a first magnet inside a tank containing a fluid bath comprises supporting the roller via a pocket formed in a wall of the tank.

10. The method of claim 9 further comprising offsetting the first and second magnet such that the first magnet is attracted outwardly toward the second magnet.

11. A method of rotating an object contained in the fluid bath, comprising:

placing a roller inside a tank containing a fluid bath;

magnetically coupling the roller through a wall of the tank, to an external magnet; and rotating the external magnet to thereby cause rotation of the roller.

* * * * *